(12) United States Patent
Ooike

(10) Patent No.: US 8,278,717 B2
(45) Date of Patent: Oct. 2, 2012

(54) SEMICONDUCTOR MEMORY DEVICE AND METHOD OF MANUFACTURING THE SAME

(75) Inventor: Noboru Ooike, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/851,112

(22) Filed: Aug. 5, 2010

(65) Prior Publication Data

US 2011/0049636 A1   Mar. 3, 2011

(30) Foreign Application Priority Data

Aug. 27, 2009   (JP) .................................. 2009-196452

(51) Int. Cl.
*H01L 29/78* (2006.01)
*H01L 21/8239* (2006.01)

(52) U.S. Cl. .................. 257/368; 257/510; 257/E27.06; 257/E21.409; 438/218; 438/296

(58) Field of Classification Search .................. 257/368, 257/510, E29.02, E27.06, E21.409; 438/218, 438/284, 296, 294

See application file for complete search history.

(56) References Cited

U.S. PATENT DOCUMENTS

| | | | |
|---|---|---|---|
| 7,566,926 | B2 | 7/2009 | Matsunaga |
| 2008/0303068 | A1* | 12/2008 | Grill et al. ...................... 257/288 |
| 2009/0050972 | A1* | 2/2009 | Lindsay et al. ................ 257/368 |
| 2009/0289284 | A1* | 11/2009 | Goh et al. ...................... 257/288 |
| 2009/0302391 | A1* | 12/2009 | Lee et al. ...................... 257/369 |

FOREIGN PATENT DOCUMENTS

| | | |
|---|---|---|
| JP | 2006-49915 | 2/2006 |
| JP | 2006-60138 | 3/2006 |
| JP | 2007-201240 | 8/2007 |
| JP | 2008-91863 | 4/2008 |
| JP | 2009-70918 | 4/2009 |
| JP | 2009-070918 A * | 4/2009 |
| JP | 2009-522796 | 6/2009 |
| WO | WO 2007/080048 A1 | 7/2007 |

OTHER PUBLICATIONS

Tan, Kian-Ming et al., "A High-Stress Liner . . . ", IEEE Electron Device Letters, vol. 29, No. 2, Feb. 2008, pp. 192-194.*
Japanese Office Action issued Nov. 22, 2011, in Patent Application No. 2009-196452 (with English-language translation).

* cited by examiner

*Primary Examiner* — Tuan N. Quach

(74) *Attorney, Agent, or Firm* — Oblon, Spivak, McClelland, Maier & Neustadt, L.L.P.

(57) ABSTRACT

In one embodiment, a semiconductor memory device includes a semiconductor substrate, and isolation layers formed in a surface of the semiconductor substrate, and separating the semiconductor substrate into active areas, the isolation layers and the active areas being alternately arranged along a predetermined direction parallel to the surface of the semiconductor substrate, a height of upper surfaces of the isolation layers being lower than a height of an upper surface of the semiconductor substrate. The device further includes diffusion layers formed on surfaces of the active areas, and a stress liner formed on upper surfaces and side surfaces of the diffusion layers, and formed of a material having a lattice constant smaller than a lattice constant of a material formed of the semiconductor substrate.

10 Claims, 12 Drawing Sheets

SEMICONDUCTOR MEMORY DEVICE AND METHOD OF MANUFACTURING THE SAME

CROSS REFERENCE TO RELATED APPLICATION

This application is based upon and claims the benefit of priority from the prior Japanese Patent Application No. 2009-196452, filed on Aug. 27, 2009, the entire contents of which are incorporated herein by reference.

FIELD

Embodiments described herein relate to a semiconductor memory device and a method of manufacturing the same, for example, to a NAND nonvolatile semiconductor memory.

BACKGROUND

In a NAND device, diffusion layers generally are formed on the surface of an Si (silicon) substrate in a contact region between select gates (SG) of NAND strings, so as to lower the contact resistance. In such a NAND device, STI (Shallow Trench Isolation) layers and AA (Active Area) layers are generally provided on the surface of the Si substrate, and the diffusion layers are formed on the surfaces of the AA layers.

However, when the diffusion layers formed on the surface of the Si substrate are annealed, strains are caused in the Si due to impurities doped in the Si substrate, so that the Si in the regions where the diffusion layers are formed is expanded. As a result, the crystalline structure of the Si is broken, so that crystal defects are formed in the Si.

The Si expansion induces a short-circuiting between adjacent NAND strings, and increases a junction leak. The increase of the junction leak causes problems such as a variation of the threshold voltage of the memory cells, deterioration of the memory cells, and degradation of the boost efficiency of unselected NAND strings. Therefore, in cases where the diffusion layers are formed on the surface of the Si substrate as described above, the Si expansion should be prevented.

JP-A 2006-60138 (KOKAI) discloses a NAND semiconductor memory device that includes a NAND string including cell transistors and select transistors, spacer layers formed on the side surfaces of the cell transistors and the select transistors, and insulators buried between the transistors forming the NAND string via the spacer layers. In JP-A 2006-60138 (KOKAI), silicon oxide layers are disclosed as an example of the spacer layers, and silicon nitride layers are disclosed as an example of the insulators.

JP-A 2008-91863 (KOKAI) discloses a method of manufacturing a semiconductor device, the method generating a compression stress by forming an etching mask with an amorphous carbon layer. According to JP-A 2008-91863 (KOKAI), the amorphous carbon layer is formed at a predetermined temperature, so that lifting phenomena of stack layers are suppressed.

DETAILED DESCRIPTION

Figure 1:
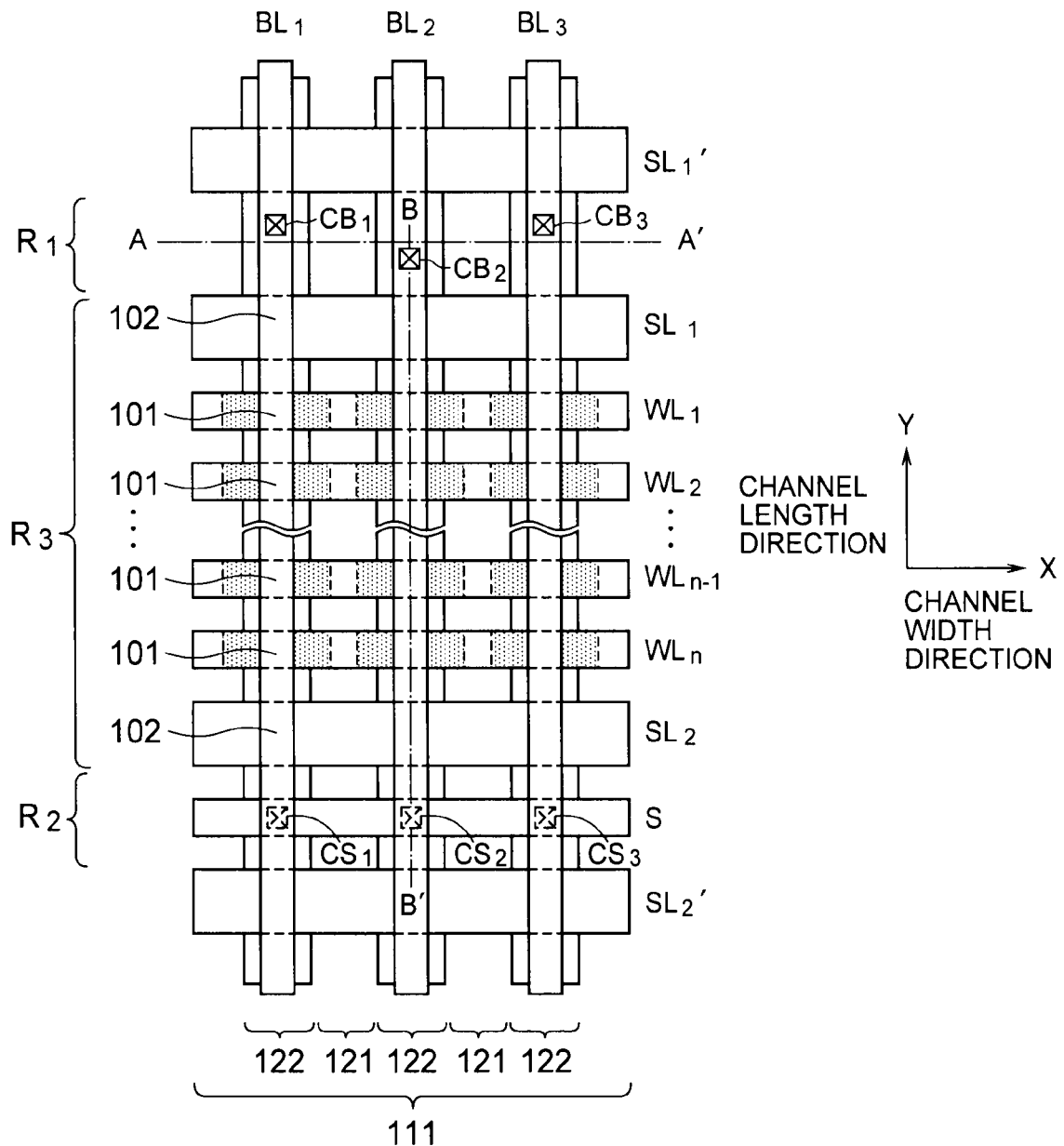
FIG. 1 is a plan view showing a configuration of a semiconductor memory device according to an embodiment described herein.

Embodiments will now be described with reference to the accompanying drawings.

An embodiment described herein is, for example, a semiconductor memory device including a semiconductor substrate, and isolation layers formed in a surface of the semiconductor substrate, and separating the semiconductor substrate into active areas, the isolation layers and the active areas being alternately arranged along a predetermined direction parallel to the surface of the semiconductor substrate, a height of upper surfaces of the isolation layers being lower than a height of an upper surface of the semiconductor substrate. The device further includes diffusion layers formed on surfaces of the active areas, and a stress liner formed on upper surfaces and side surfaces of the diffusion layers, and formed of a material having a lattice constant smaller than a lattice constant of a material formed of the semiconductor substrate.

Another embodiment described herein is, for example, a method of manufacturing a semiconductor memory device, the method including forming isolation layers on a surface of a semiconductor substrate to separate the substrate into active areas, the isolation layers and the active areas being arranged along a predetermined direction parallel to the surface of the semiconductor substrate, and forming diffusion layers on surfaces of the active areas. The method further includes forming a stress liner on upper surfaces of the diffusion layers, the stress liner being formed of a material having a lattice constant smaller than a lattice constant of a material formed of the semiconductor substrate, and annealing the diffusion layers after the stress liner is formed.

Another embodiment described herein is, for example, a semiconductor memory device including a semiconductor substrate, and isolation layers formed in a surface of the semiconductor substrate, and separating the semiconductor substrate into active areas, the isolation layers and the active areas being alternately arranged along a first direction parallel to the surface of the semiconductor substrate, and extending in a second direction perpendicular to the first direction, a height of upper surfaces of the isolation layers being lower than a height of an upper surface of the semiconductor substrate. The device further includes memory strings, each of the memory strings including cell transistors formed on one of the active areas along to the second direction, and first and second select transistors formed on the active area and arranged to sandwich the cell transistors. The device further includes diffusion layers formed in surfaces of the active areas between the memory strings, and a stress liner formed on upper surfaces and side surfaces of the diffusion layers, and formed of a material having a lattice constant smaller than a lattice constant of a material formed of the semiconductor substrate. The device further includes insulators buried between the cell transistors and between the cell transistors and the select transistors, a compression stress of the insulators to the material formed of the substrate being smaller than a compression stress of the stress liner to the material formed of the substrate.

FIG. 1 is a plan view showing a configuration of a semiconductor memory device according to an embodiment described herein. The semiconductor memory device of FIG. 1 is a NAND nonvolatile semiconductor memory.

FIG. 1 illustrates a configuration of a memory cell array of the semiconductor memory device. In the memory cell array, cell transistors 101 and select transistors 102 are arranged in a two-dimensional array on a semiconductor substrate 111. FIG. 1 shows an X-direction and a Y-direction that are parallel to the surface of the semiconductor substrate 111 and are perpendicular to each other. The X-direction is a channel width direction of those transistors, and the Y-direction is a channel length direction of those transistors.

Isolation layers 121 which are an example of STI (Shallow Trench Isolation) layers and active areas 122 which are an example of AA (Active Area) layers are provided on the surface of the semiconductor substrate 111, and the isolation layers 121 separate the semiconductor substrate 111 into the active areas 122. The isolation layers 121 and the active areas 122 are alternately arranged along the X-direction, and each of those layers extends in the Y-direction. The X-direction is an example of a predetermined direction and a first direction of the disclosure, and the Y-direction is an example of a direction perpendicular to the predetermined direction and a second direction of the disclosure. The cell transistors 101 and the select transistors 102 are formed on the active areas 122, as shown in FIG. 1.

FIG. 1 also shows word lines $WL_1$ to $WL_n$ (n is an integer of 2 or larger) extending in the X-direction, and select lines $SL_1$ and $SL_2$ extending in the X-direction. In this embodiment, control gate electrodes of the cell transistors 101 are designed to extend in the X-direction, to form the word lines $WL_1$ to $WL_n$. Also, control gate electrodes of the select transistors 102 are designed to extend in the X-direction, to form the select lines $SL_1$ and $SL_2$.

FIG. 1 further shows bit lines $BL_1$ to $BL_3$ extending in the Y-direction, and bit line contacts $CB_1$ to $CB_3$ connected to the bit lines $BL_1$ to $BL_3$. As shown in FIG. 1, the cell transistors 101 are placed at the intersecting points between the word lines $WL_1$ to $WL_n$ and the bit lines $BL_1$ to $BL_3$, and the select transistors 102 are placed at the intersecting points between the select lines $SL_1$ and $SL_2$ and the bit lines $BL_1$ to $BL_3$. The bit line contacts $CB_1$ to $CB_3$ are formed on the active areas 122, as shown in FIG. 1.

FIG. 1 further shows a source line S extending in the X-direction, and source line contacts $CS_1$ to $CS_3$ connected to the source line S. The source line contacts $CS_1$ to $CS_3$ are formed on the active areas 122, as shown in FIG. 1.

FIG. 1 further shows a select line $SL_1'$ adjacent to the select line $SL_1$, and a select line $SL_2'$ adjacent to the select line $SL_2$. Word lines (not shown) are further formed on the opposite side of the select line $SL_1'$ from the select line $SL_1$ and on the opposite side of the select line $SL_2'$ from the select line $SL_2$. As shown in FIG. 1, the bit line contacts $CB_1$ to $CB_3$ are formed in a contact region $R_1$ between the select line $SL_1$ and the select line $SL_1'$, and the source line contacts $CS_1$ to $CS_3$ are formed in a contact region $R_2$ between the select line $SL_2$ and the select line $SL_2'$. The cell transistors 101 and the select transistors 102 are formed in the region sandwiched between the contact regions, as shown in FIG. 1. In FIG. 1, $R_3$ represents the region sandwiched between the contact regions $R_1$ and $R_2$.

Figure 2:
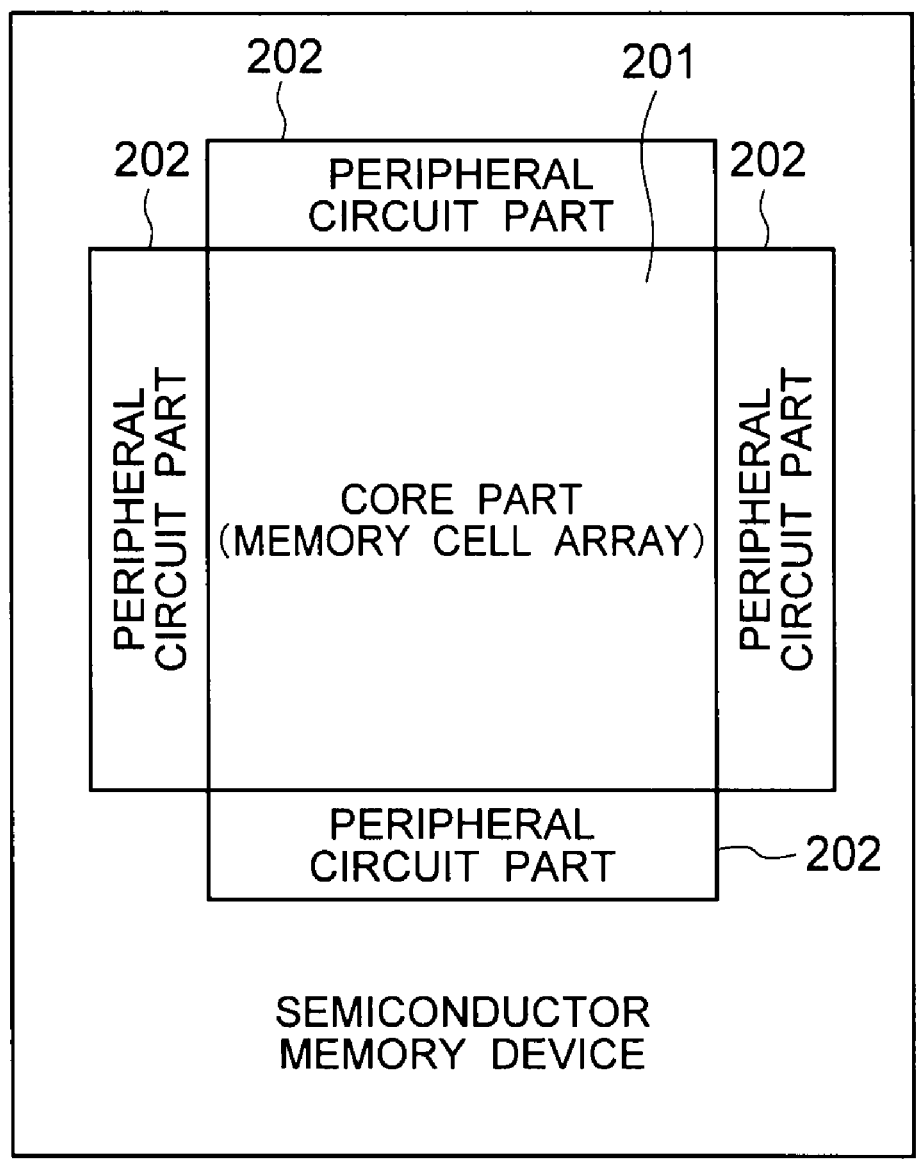
FIG. 2 is a plan view schematically showing the configuration of the semiconductor memory device of the embodiment.

FIG. 2 is a plan view schematically showing the configuration of the semiconductor memory device of this embodiment.

The semiconductor memory device of this embodiment includes a core part 201 which is the above described memory cell array, and peripheral circuit parts 202 placed around the core part 201. The above described cell transistors and select transistors are arranged in the core part 201, and peripheral transistors are arranged in the peripheral circuit parts 202.

Referring to sectional side views of FIGS. 3 to 5, the configuration of the semiconductor memory device of this embodiment will be described in detail.

Figure 3:
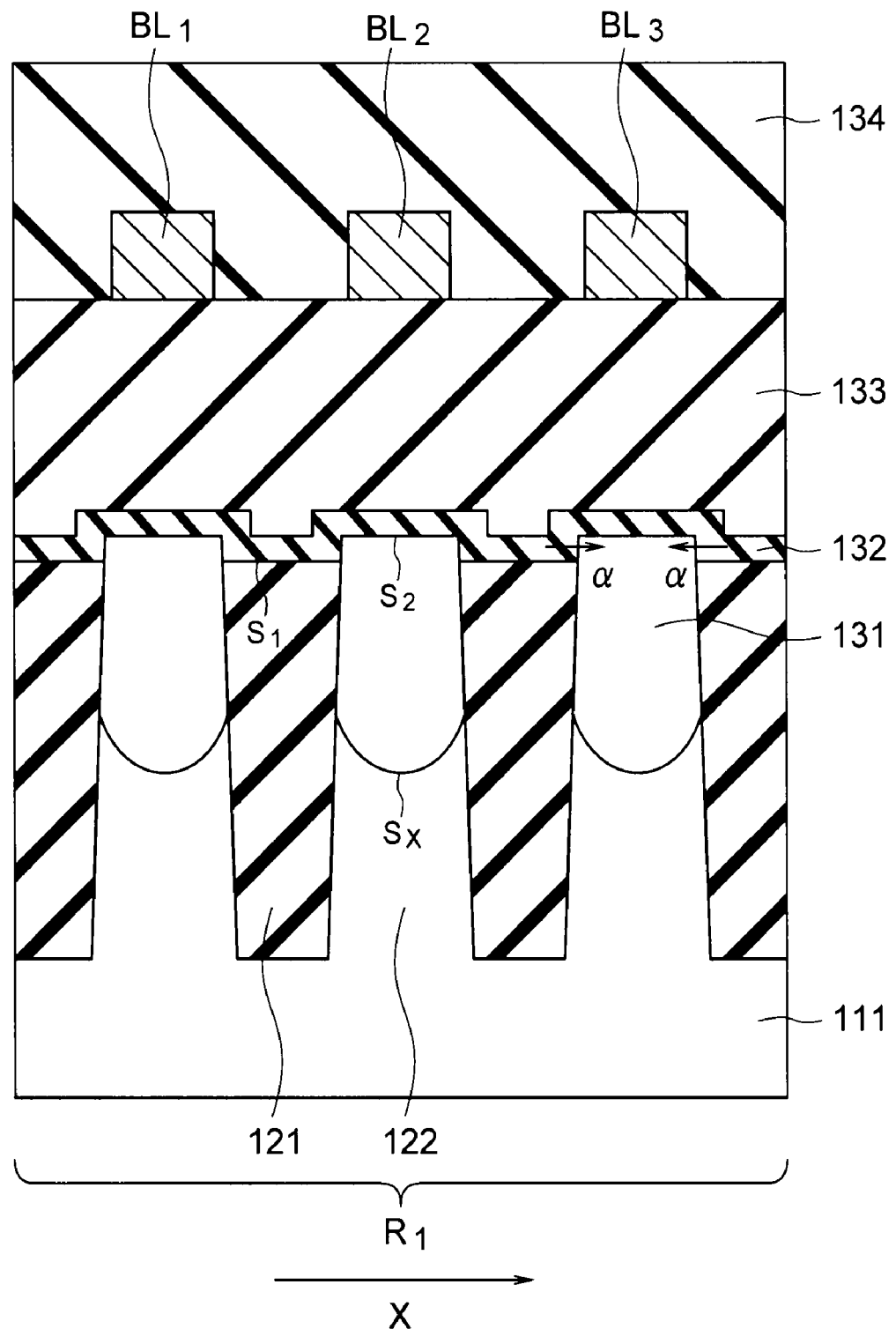
FIGS. 3 to 5 are sectional side views showing the configuration of the semiconductor memory device of the embodiment.

FIG. 3 is a sectional side view showing the configuration of the semiconductor memory device of this embodiment, taken along the line A-A' of FIG. 1. Therefore, FIG. 3 shows a section of the contact region $R_1$ parallel to the X-direction.

As shown in FIG. 3, the semiconductor memory device of this embodiment includes the semiconductor substrate 111, the isolation layers 121, the active areas 122, diffusion layers 131, a stress liner 132, an inter layer dielectric 133, and a further inter layer dielectric 134. FIG. 3 further shows the bit lines $BL_1$ to $BL_3$ that are formed on the inter layer dielectric 133 and are covered with the inter layer dielectric 134. Those bit lines $BL_1$ to $BL_3$ are electrically connected to the bit line contacts $CB_1$ to $CB_3$ (see FIG. 1), respectively.

As described above, the isolation layers 121 and the active areas 122 are formed on the surface of the semiconductor substrate 111, and are alternately arranged along the X-direction. In this embodiment, the height of the upper surface $S_1$ of each of the isolation layers 121 is lower than the height of the upper surface $S_2$ of each of the active areas 122 (i.e., the height of the upper surface of the semiconductor substrate 111), as shown in FIG. 3. In this embodiment, the semiconductor substrate 111 is a silicon substrate, and the isolation layers 121 are silicon oxide layers.

The diffusion layers 131 are formed on the surfaces of the active areas 122. In this embodiment, by forming the diffusion layers 131 on the surfaces of the active areas 122 in the contact region, the contact resistance is lowered. In this embodiment, the active areas 122 are p-type layers, and the diffusion layers 131 are n-type layers. In FIG. 3, Sx represents the bottoms (bottom surfaces) of the diffusion layers 131 defined as the boundaries between the p-type layers and the n-type layers. In this embodiment, the bottom surfaces Sx of the diffusion layers 131 are lower than the upper surfaces $S_1$ of the isolation layers 121, as shown in FIG. 3.

The stress liner 132 is formed on the isolation layers 121 and the active areas 122. More specifically, the stress liner 132 is continuously formed, in the channel width direction, on the upper surfaces of the isolation layers 121 and on the upper surfaces and side surfaces of the diffusion layers 131. The stress liner 132 covers the diffusion layers 131 protruding from the upper surfaces of the isolation layers 121.

In this embodiment, the stress liner 132 is formed of a material having a lattice constant smaller than the lattice constant of a material of the semiconductor substrate 111. With this arrangement, a compression stress is applied from the stress liner 132 to the diffusion layers 131. In this embodiment, the stress liner 132 is made of SiC (silicon carbide), while the semiconductor substrate 111 is made of silicon. The lattice constant of Si is 0.553 nm, and the lattice constant of C is 0.366 nm. Accordingly, the lattice constant of SiC is smaller than the lattice constant of Si. The stress liner 132 may be made of a material other than SiC, such as SiN (silicon nitride). A SiC layer is an example of the insulating layer containing silicon and carbon in the disclosure, and a SiN layer is an example of the insulating layer containing silicon and nitrogen in the disclosure.

To form the diffusion layers 131 on the surface of the Si substrate (semiconductor substrate) 111 as in this embodiment, the impurities in the diffusion layers 131 is activated by annealing. In this annealing, the Si in the regions where the diffusion layers 131 are formed is expanded, which results in a problem. At the same time, the crystalline structure of the Si is broken, so that crystal defects are formed in the Si, which also results in a problem. The Si expansion induces a short-circuiting between adjacent NAND strings. The Si expansion might also increase a junction leak caused when a voltage is applied to the bit line contacts.

In this embodiment, to counter those problems, the stress liner 132 made of SiC having a smaller lattice constant than the lattice constant of Si is formed on the upper surfaces and side surfaces of the diffusion layers 131. With this arrangement, a stress that is the opposite of the expansion stress of Si, i.e, a compression stress, is applied to the diffusion layers 131, so that the Si expansion is prevented. In this manner, the short-circuiting among the NAND strings can be prevented in this embodiment. The junction leak caused when a voltage is applied to the bit line contacts can also be reduced. In FIG. 3, the compression stress is indicated by the arrows $\alpha$.

The magnitude of the compression stress applied by the stress liner 132 can be controlled by changing the thickness of the stress liner 132 or the composition ratio between Si and C. The compression stress becomes larger by making the thickness greater or by making the proportion of C to Si larger. In this embodiment, the thickness of the stress liner 132 is 4 nm to 5 nm, and the proportion (concentration) of C in SiC is approximately 1%, for example. The structure of the SiC forming the stress liner 132 may be an amorphous structure or a diamond structure.

The Si expansion and the generation of the crystal defects become more prominent as the isolation layers 121 and the active areas 122 become smaller in the X-direction. Therefore, the prevention of the Si expansion and the crystal defect generation in this embodiment becomes more effective as a degree of integration in the semiconductor memory device is more advanced.

The inter layer dielectric 133 is formed on the stress liner 132. In this embodiment, the inter layer dielectric 133 is a silicon oxide layer. FIG. 3 further shows the bit lines $BL_1$ to $BL_3$ formed on the inter layer dielectric 133. The bit lines $BL_1$ to $BL_3$ are covered with the inter layer dielectric 134. In this embodiment, the inter layer dielectric 134 is a silicon oxide layer.

As described above, the diffusion layers 131 and the stress liner 132 are formed in the contact region $R_1$ for the bit line contacts in this embodiment. The diffusion layers 131 and the stress liner 132 are also formed in the contact region $R_2$ for the source line contacts.

Figure 4:
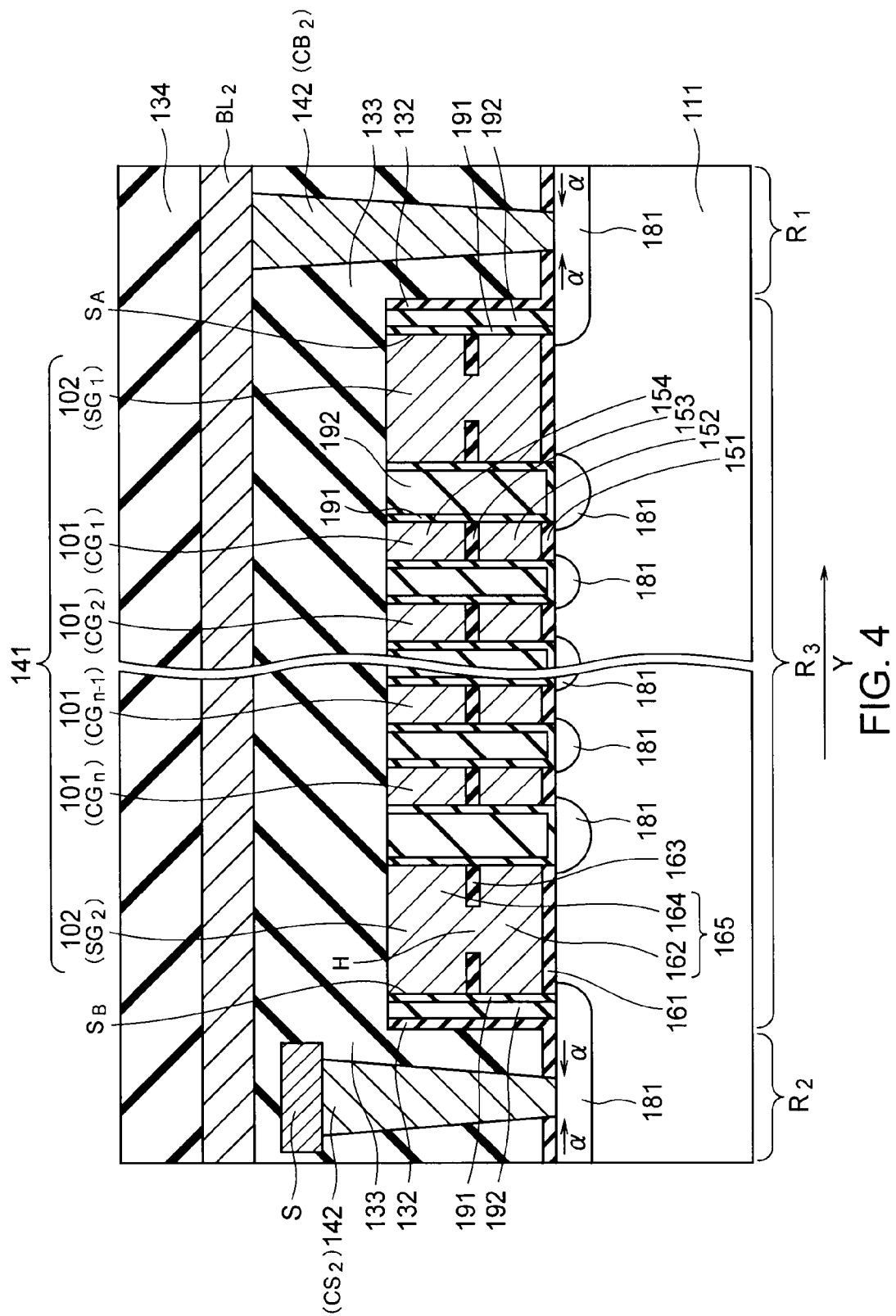

FIG. 4 is a sectional side view of the configuration of the semiconductor memory device of this embodiment, taken along the line B-B' of FIG. 1. Therefore, FIG. 4 shows a section of the regions $R_1$ to $R_3$ parallel to the Y-direction.

FIG. 4 shows a NAND string 141 that includes n pieces of cell transistors 101 arranged in a line along the Y-direction, and two select transistors 102 arranged to sandwich those cell transistors 101. In FIG. 4, the cell transistors 101 are denoted by $CG_1$ to $CG_n$, and the select transistors 102 are denoted by $SG_1$ and $SG_2$. Although FIG. 4 shows only one NAND string 141, other NAND strings having the same configuration as the NAND string 141 are arranged in the Y-direction from the NAND string 141, i.e., on right and left of the NAND string 141 in FIG. 4. The regions $R_1$ and $R_2$ are between these NAND strings.

FIG. 4 further shows two contact plugs 142 formed adjacent to the select transistors 102. The contact plug 142 adjacent to the select transistor $SG_1$ is the bit line contact $CB_2$ shown in FIG. 1, and the contact plug 142 adjacent to the select transistor $SG_2$ is the source line contact $CS_2$ shown in FIG. 1. FIG. 4 further shows the bit line $BL_2$ connected to the bit line contact $CB_2$, and the source line S connected to the source line contact $CS_2$.

The NAND string 141 is an example of a memory string of the disclosure. The cell transistors $CG_1$ to $CG_n$ are examples of cell transistors forming the memory string, and the select transistors $SG_1$ and $SG_2$ are examples of first and second select transistors forming the memory string. The bit line contact $CB_2$ and the source line contact $CS_2$ are examples of first and second contact plugs of the disclosure.

As shown in FIG. 4, each of the cell transistors 101 includes a gate insulator 151, a floating gate electrode 152 as an example of a first gate electrode of the disclosure, an intergate insulator 153, and a control gate electrode 154 as an example of a second gate electrode of the disclosure.

The gate insulator 151 is formed on the semiconductor substrate 111. The gate insulator 151 is a silicon oxide layer, for example. The gate insulator 151 functions as a tunnel insulator of the cell transistor 101.

The floating gate electrode 152 is formed on the gate insulator 151. The floating gate electrode 152 is a polysilicon layer, for example. The floating gate electrode 152 functions as a signal charge storage layer of the cell transistor 101.

The intergate insulator 153 is formed on the floating gate electrode 152. The intergate insulator 153 is a silicon oxide layer, a silicon nitride layer, an ONO (oxide, nitride, and oxide) stack layer, or a high-k layer, for example.

The control gate electrode 154 is formed on the intergate insulator 153. The control gate electrode 154 has a two-layer structure that is formed with a polysilicon layer and a silicide layer formed on the polysilicon layer, for example. Alternatively, the control gate electrode 154 may have a single-layer structure formed only with a polysilicon layer or a single-layer structure formed only with a silicide layer. Examples of the silicide layer include a tungsten silicide ($WSi_2$) layer, a molybdenum silicide ($MoSi_2$) layer, a cobalt silicide ($CoSi_2$) layer, a titanium silicide ($TiSi_2$) layer, a nickel silicide ($NiSi_2$) layer, and the like.

Source and drain diffusion layers 181 formed to sandwich the floating gate electrode 152 and the control gate electrode 154 are formed for the respective cell transistors 101. Each of the source and drain diffusion layers 181 of each cell transistor 101 is shared with an adjacent cell transistor 101 or an adjacent select transistor 102. With this arrangement, the cell transistors 101 and the select transistors 102 forming the NAND string 141 are connected in series to one another.

As shown in FIG. 4, each of the select transistors 102 includes a gate insulator 161 and a gate electrode 165.

The gate insulator 161 is formed on the semiconductor substrate 111. The gate insulator 161 of each select transistor 102 is formed from the same insulator as the gate insulator 151 of each cell transistor 101 in the manufacture process of the semiconductor memory device.

The gate electrode 165 is formed on the gate insulator 161. The gate electrode 165 includes a first conductive layer 162 formed on the gate insulator 161, and a second conductive layer 164 formed on the first conductive layer 162 via an insulating layer 163. An opening H is formed in the insulating layer 163, and the first conductive layer 162 and the second conductive layer 164 are electrically connected to each other via the opening H. The first conductive layer 162, the insulating layer 163, and the second conductive layer 164 are formed from the same conductive layer as the floating gate electrode 152, the same insulation layer as the intergate insulator 153, and the same conductive layer as the control gate electrode 154, respectively, in the manufacture process of the semiconductor memory device.

The source and drain diffusion layers 181 formed to sandwich the gate electrodes 165 are provided for the select transistors 102. Each of the source/drain diffusion layers 181 of each select transistor 102 is shared with an adjacent cell transistor 101 or electrically connected to an adjacent contact plug 142. With this arrangement, the cell transistors 101 and the select transistors 102 forming the NAND string 141 are electrically connected to the bit lines and the source lines through those contact plugs 142.

The semiconductor memory device of this embodiment further includes spacer layers 191, insulating layers 192, the stress liner 132, and the inter layer dielectric 133, as shown in FIG. 4.

The spacer layers 191 are formed on the side surfaces of the cell transistors 101 and the select transistors 102. The spacer layers 191 are silicon oxide layers, for example.

As shown in FIG. 4, the insulating layers 192 are buried between the cell transistors 101 and between the select transistors 102 and the cell transistors 101 via the spacer layers 191. The space between select transistors 102 adjacent via a contact region is not completely filled with the insulating layers 192. An insulating layer 192 is formed on a side surface of each select transistor 102 via a spacer layers 191, which is the opposite side surface from an adjacent cell transistor 101. The insulating layers 192 are TEOS (Tetra Ethyl Ortho Silicate) layers, for example.

As described above, spaces between adjacent transistors forming the NAND string 141 are filled with the spacer layers 191 and the insulating layers 192 in this embodiment. The gate insulators 151 and 161, the spacer layers 191, and the insulating layers 192 are made of materials having a smaller stress on Si, compared to the stress liners 132. The spacer layers 191 and the insulating layers 192 are examples of insulators having a smaller compression stress on the material formed of the semiconductor substrate than that of the stress liner in the disclosure. The compression stress of the spacer layers 191 and the insulating layers 192 on Si is smaller than the compression stress of the stress liners 132 on Si. In this embodiment, the stress liners 132 are formed after the spacer layers 191 and the insulating layers 192 are formed.

Accordingly, in the region $R_3$ in which the NAND string 141 is formed, the stress liner 132 is formed on the side surfaces of the select transistors 102 on the outside of the NAND string 141 (on the opposite sides from the cell transistors 101), as shown in FIG. 4. However, the stress liner 132 is not formed between the transistors in the NAND string 141. In FIG. 4, the side surfaces of the select transistors $SG_1$ and $SG_2$ on the opposite sides from the cell transistors 101 are denoted by $S_A$ and $S_B$. In the region $R_3$, the stress liner 132 is formed only on the side surfaces $S_A$ and $S_B$ via the spacer layers 191 and the insulating layers 192, and is not formed between the cell transistors 101 and between the select transistors 102 and the cell transistor 101.

In the contact regions $R_1$ and $R_2$, the stress liner 132 is formed on the upper surfaces of the isolation layers 121 and on the upper surfaces and side surfaces of the diffusion layers 131 (see FIG. 3). In FIG. 4, the compression stress acting on the diffusion layers 131 is indicated by the arrows α, as in FIG. 3.

As described above, the stress liner 132 is formed on the side surfaces of the select transistors 102 on the outside of the NAND string 141, but is not formed between the transistors in the NAND string 141 in this embodiment. With this arrangement, the stress due to the stress liner 132 can be prevented from changing the threshold voltage of the cell transistors 101 in this embodiment. In this embodiment, the materials of the spacer layers 191 and the insulating layers 192 have a smaller compression stress on a silicon layer than a compression stress of the stress liner 132 on the silicon layer.

Figure 5:
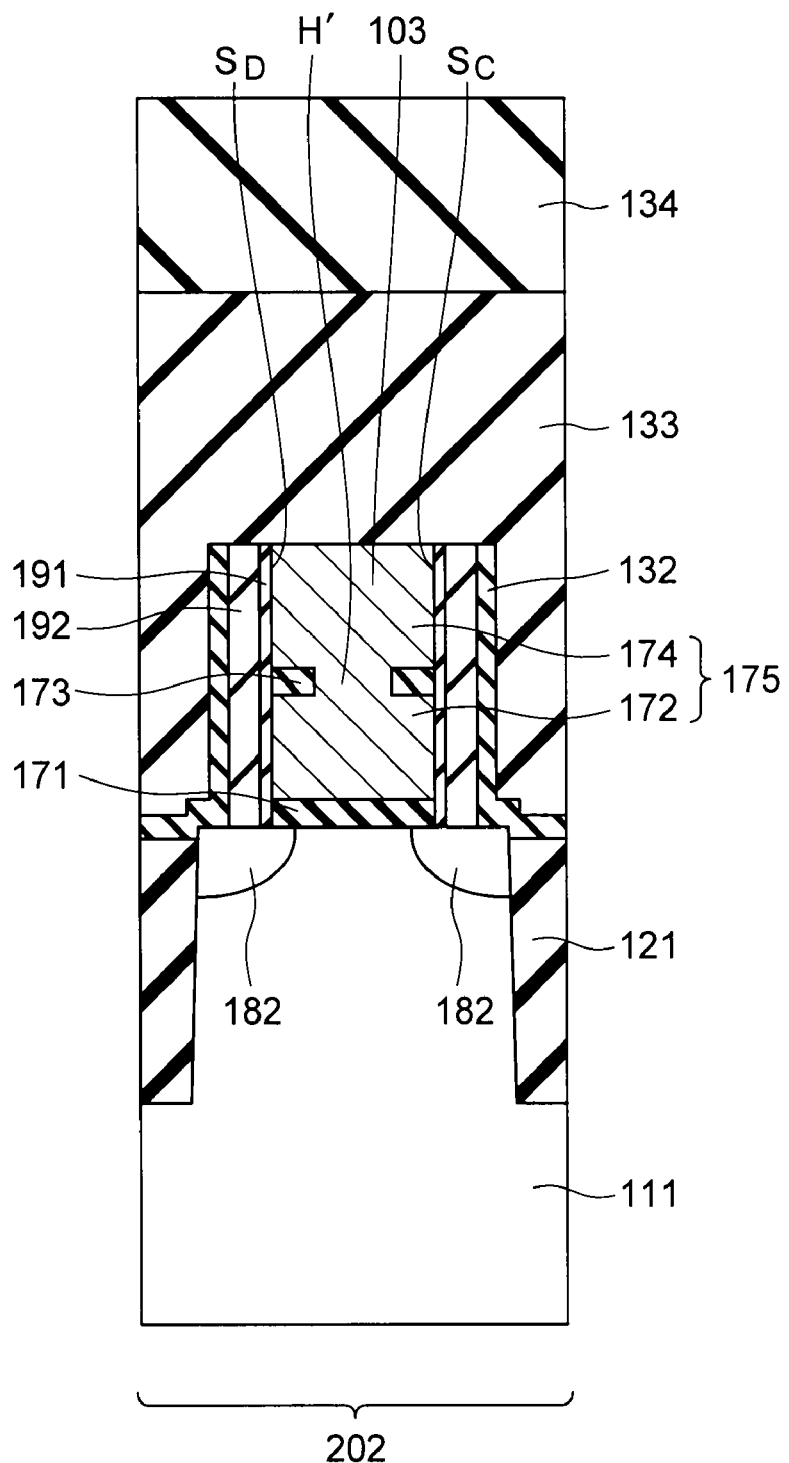

FIG. 5 is a sectional side view of the configuration of the semiconductor memory device of this embodiment. While FIGS. 3 and 4 are sectional views of the core part 201 (see FIG. 2), FIG. 5 is a sectional view of one of the peripheral circuit parts 202.

FIG. 5 shows a section of a peripheral transistor 103 provided in the peripheral circuit part 202. Each peripheral transistor 103 in the peripheral circuit parts 202 includes a gate insulator 171 and a gate electrode 175, as shown in FIG. 5.

The gate insulator 171 is formed on the semiconductor substrate 111. The gate insulator 171 of each peripheral transistor 103 is formed from the same insulator as the gate insulator 151 of each cell transistor 101.

The gate electrode 175 is formed on the gate insulator 171. The gate electrode 175 includes a first conductive layer 172 formed on the gate insulator 171, and a second conductive layer 174 formed on the first conductive layer 172 via an insulating layer 173. An opening H' is formed in the insulating layer 173, and the first conductive layer 172 and the second conductive layer 174 are electrically connected to each other via the opening H'. The first conductive layer 172, the insulating layer 173, and the second conductive layer 174 are formed from the same conductive layer as the floating gate electrode 152, the same insulator as the intergate insulator 153, and the same conductive layer as the control gate electrode 154 in the manufacture process of the semiconductor memory device.

Source and drain diffusion layers 182 formed to sandwich the gate electrode 175 are also provided for each peripheral transistor 103.

Like FIG. 4, FIG. 5 further shows the spacer layers 191, the insulating layers 192, the stress liner 132, and the inter layer dielectric 133, on the side surfaces of the gate electrode 175. The distance between neighboring gate electrodes 175 is longer than the distance between neighboring cell transistors 101 and the distance between neighboring select transistor 102 and cell transistor 101. Accordingly, the space between neighboring gate electrodes 175 is not completely filled with the spacer layers 191, the insulating layers 192, and the stress liner 132.

In FIG. 5, two side surfaces of the peripheral transistor 103 are denoted by $S_C$ and $S_D$. In each peripheral circuit part 202, the stress liner 132 is formed on the side surfaces $S_C$ and $S_D$ of each peripheral transistor 103 via the spacer layers 191 and the insulating layers 192.

Referring now to FIGS. 4 and 5, the cell transistors 101 are compared with the peripheral transistors 103.

In this embodiment, the stress liners 132 are not formed on the side surfaces of the cell transistors 101, as shown in FIG. 4. With this arrangement, the stress from the stress liners 132 does not change the threshold voltage of the cell transistors 101 in this embodiment.

On the other hand, in this embodiment, the stress liner 132 is formed on the side surfaces of the peripheral transistors 103 (gate electrodes 175), as shown in FIG. 5. With this arrangement, the stress by the stress liner 132 affects the threshold voltage of the peripheral transistors 103 in this embodiment.

However, the size of each peripheral transistor 103 is normally much larger than the size of each cell transistor 101, in terms of channel width and channel length. Accordingly, the influence of the stress on the peripheral transistors 103 is small.

In this embodiment, the stress liner 132 is formed on the upper surfaces and side surfaces of the diffusion layers 131 in the contact regions $R_1$ and $R_2$, so as to prevent the Si expansion and the generation of the crystal defects (FIG. 3). At this time, the stress liner 132 is formed not only on the upper surfaces and side surfaces of the diffusion layers 131 but also on the side surfaces of the peripheral transistors 103. However, since the influence of the stress on the peripheral transistors 103 is small, the formation of the stress liner 132 can prevent the Si expansion without adversely affecting the threshold voltage of the peripheral transistors 103 in this embodiment.

The stress on the peripheral transistors 103 acts in such a direction as to increase the ON current, in case the peripheral transistors 103 are n-type transistors. In case the peripheral transistors 103 are p-type transistors, the stress acts in such a direction as to reduce the OFF current. Accordingly, as long as the stress is not too large, the stress contributes to improvement of the characteristics of the peripheral transistors 103. To set the magnitude of the stress from the stress liner 132, it is considered the balance between the magnitude for the diffusion layers and the magnitude for the peripheral transistors 103. As described above, the magnitude of the stress from the stress liner 132 can be controlled by changing the thickness or the composition of the stress liner 132.

Referring to a sectional side view of FIG. 6, advantages of the stress liner 132 covering the diffusion layers 131 will be described.

Figure 6:
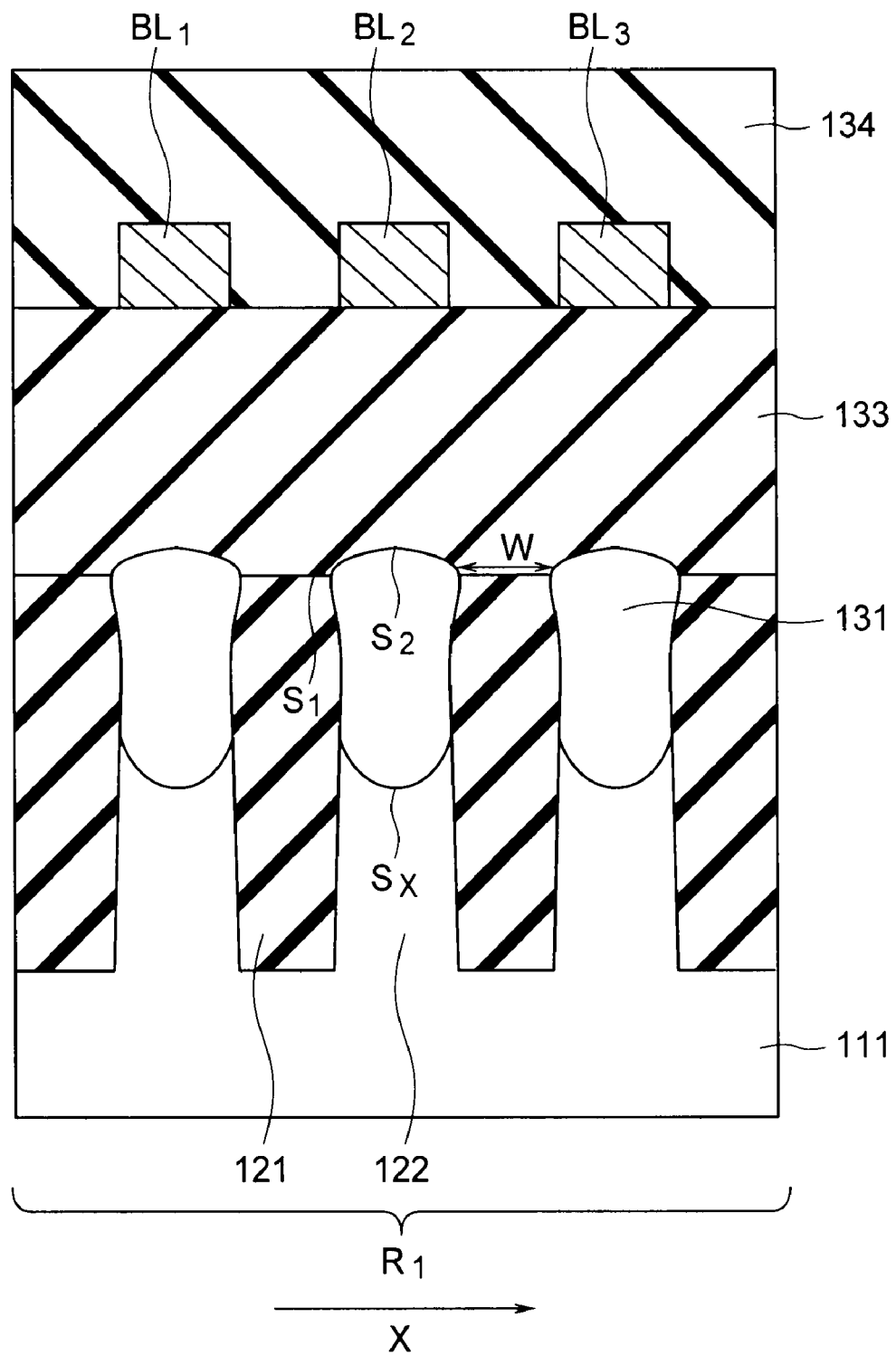
FIG. 6 is a sectional side view showing a section of diffusion layers where they are annealed while not being covered with a stress liner.

FIG. 6 is a sectional side view showing a section of the diffusion layers 131 where they are annealed while not being covered with a stress liner.

When the diffusion layers 131 are annealed without covering them by a stress liner, the Si in the regions where the diffusion layers 131 are formed is expanded, as shown in FIG. 6. As a result, the crystalline structure of the Si is broken, so that crystal defects are formed in the Si.

In FIG. 6, the distance between neighboring diffusion layers 131 is denoted by W. The Si expansion shortens the distance W, and might induce a short-circuiting between neighboring bit lines.

To counter this problem, the stress liner made of SiC having a smaller lattice constant than the lattice constant of Si is formed on the upper surfaces and side surfaces of the diffusion layers 131 in this embodiment, as described above. With this arrangement, the stress (compression stress) that is the opposite of the expansion stress of Si acts on the diffusion layers 131 to prevent the Si expansion.

In case a simulation was performed to examine the Si expansion where the upper surfaces $S_2$ of the active areas 122 were 10 nm higher than the upper surfaces $S_1$ of the isolation layers 121, the Si expansion was caused in the region of 0 to 30 nm in depth from the upper surfaces $S_2$ of the active areas 122, and the width of each of the active areas 122 became largest at a depth of approximately 10 nm after the expansion. The Si forming the active areas 122 (diffusion layers 131) became amorphous in the region where the Si is expanded, i.e, the region of 0 to 30 nm in depth. Here, it became apparent that the region in which the Si became amorphous was located higher than the bottom of each of the diffusion layers 131. Therefore, the stress liner 132 (see FIG. 3) covers at least the side surfaces of the diffution layers 131, located higher than the bottoms of the diffusion layers 131 and higher than the upper surfaces $S_1$ of the isolation layers 121. Also, with the stress liner 132 covering only the portions to become amorphous, generation of an unnecessary compression stress and crystal defects are appropriately prevented.

The Si expansion can also be prevented by covering the active areas 122 with a silicon oxide layer, forming the diffusion layers 131 through ion implantation via the silicon oxide layer, and then annealing the diffusion layers 131 covered with the silicon oxide layer. This is because the Si expansion is prevented by virtue of the hardness of the silicon oxide layer. However, simulations performed by the inventors show that the thickness of the silicon oxide layer needs to be approximately 9 nm in this case. On the other hand, the thickness of the stress liner may be as small as 4 to 5 nm, which is almost half the thickness of the silicon oxide layer. Accordingly, by using the stress liner to prevent the Si expansion, the entire device of this embodiment can be made smaller than a structure obtained in the case where the Si expansion is prevented by the hardness of the silicon oxide layer. Referring to sectional side views of FIGS. 7 to 12, a method of manufacturing the semiconductor memory device of this embodiment will be described.

FIGS. 7 to 12 are sectional side views illustrating the method of manufacturing the semiconductor memory device of this embodiment. The figures (A), (B), and (C) of each of FIGS. 7 to 12 are sectional views corresponding to FIGS. 3, 4, and 5, respectively. The figures (A) and (B) of each of FIGS. 7 to 12 show the AA section and the GC section of the memory cell array.

Figure 7:
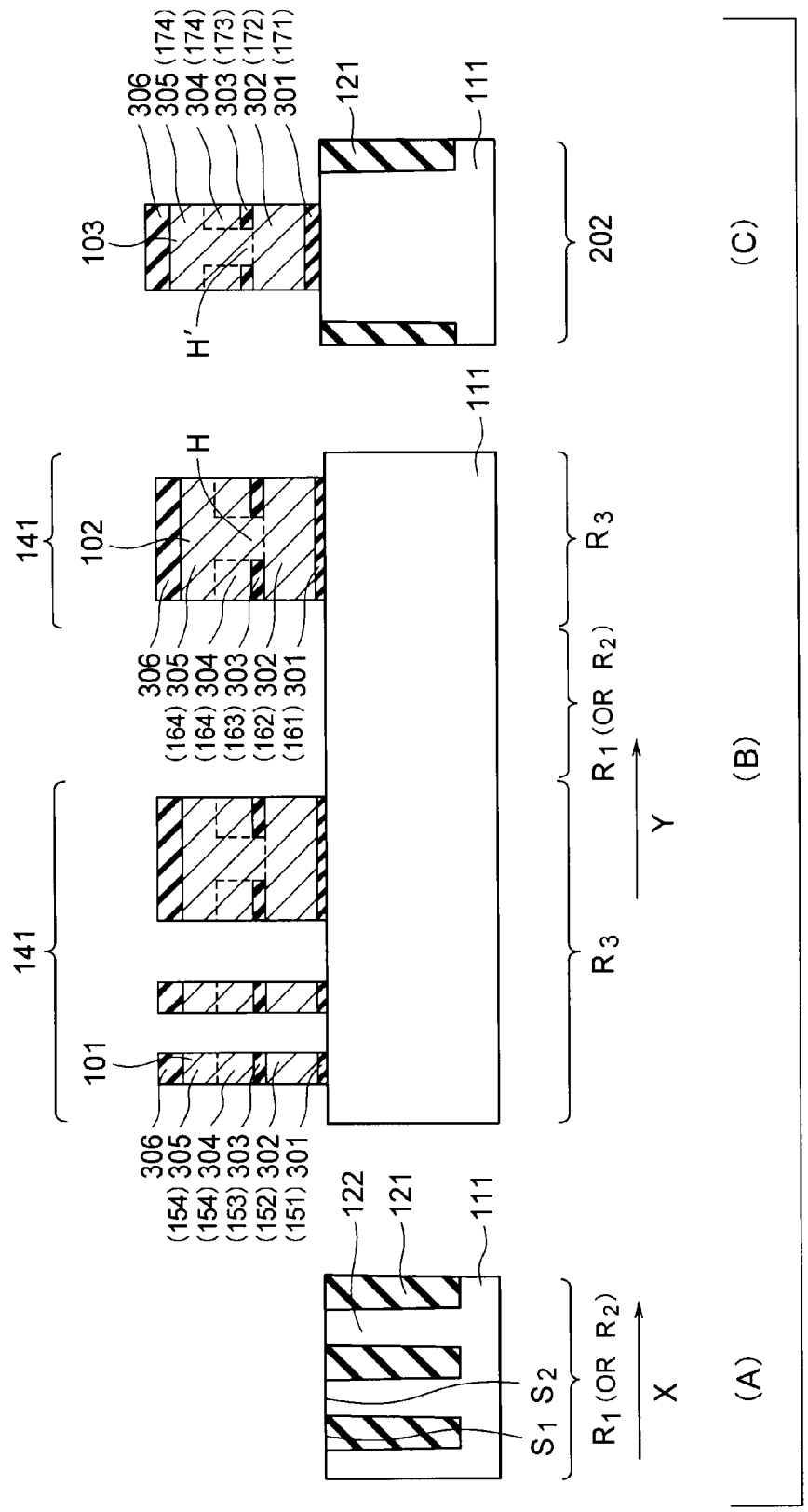
FIGS. 7 to 12 are sectional side views illustrating a method of manufacturing the semiconductor memory device of the embodiment.

As shown in FIG. 7, the isolation layers 121 and the active areas 122 are provided on the surface of the semiconductor substrate 111. In other words, the isolation layers 121 separate the semiconductor substrate 111 into the active areas 122, and the isolation layers 121 and the active areas 122 are alternately arranged along the X-direction parallel to the surface of the semiconductor substrate 111. In this embodiment, the semiconductor substrate 111 is a silicon substrate, the isolation layers 121 are silicon oxide layers, and the active areas 122 are p-type layers. At the same time, the gate structures of the cell transistors 101, the select transistors 102, and the peripheral transistors 103 are formed on the semiconductor substrate 111, as shown in FIG. 7.

The gate structures of those transistors, the isolation layers 121, and the active areas 122 are formed in the following manner.

A first insulating layer 301, a first electrode layer 302, a mask layer such as a SiN layer, and a sacrifice layer such as a $SiO_2$ layer are formed in this order on the semiconductor substrate 111. The first insulating layer 301 is used to form the gate insulators 151, 161, and 171 shown in FIGS. 3 to 5. The first electrode layer 302 is used to form the floating gate electrodes 152 and first conductive layers 162 and 172 shown in FIGS. 3 to 5.

To form isolation trenches on the surface of the semiconductor substrate 111, RIE (Reactive Ion Etching) is performed on the sacrifice layer, the mask layer, the first electrode layer 302, the first insulating layer 301, and the semiconductor substrate 111. The isolation trenches are then filled with a material of the isolation layers 121 formed of, e.g., $SiO_2$, and the surface of the material is planarized by CMP (Chemical Mechanical Polishing) to form the isolation layers 121. At this point, the mask layer serves as a CMP stopper. The isolation layers 121 are then recessed by a RIE process. The mask layer is then removed with a chemical liquid such as phosphorus acid, to expose the upper surfaces of the first electrode layer 302.

A second insulating layer 303 and a second electrode layer 304 are then formed in this order on the first electrode layer 302, and etching is performed to form the openings H and H' shown in FIGS. 4 and 5. In this manner, the openings H and H' penetrating through the second electrode layer 304 and the second insulating layer 303 are formed. The second insulating layer 303 is used to form the intergate insulators 153 and the insulating layers 163 and 173 shown in FIGS. 3 to 5. The second electrode layer 304 is used to form the control gate electrodes 154 and the second conductive layers 164 and 174 shown in FIGS. 3 to 5.

A third electrode layer 305 and a cap layer 306 are then formed on the second electrode layer 304. Like the second electrode layer 304, the third electrode layer 305 is used to form the control gate electrodes 154 and the second conductive layer 164 and 174 shown in FIGS. 3 to 5. The cap layer 306 is a SiN layer, for example.

To perform an etching for GC processing, RIE is performed on the third electrode layer 305, the second electrode layer 304, the second insulating layer 303, the first electrode layer 302, and the first insulating layer 301, using the cap layer 306 as a mask. In this manner, the gate structures of the cell transistors 101, the select transistors 102, and the peripheral transistors 103 are formed on the semiconductor substrate 111, as shown in FIG. 7. In FIG. 7(A), the upper surface of each of the isolation layers 121 is denoted by $S_1$, and the upper surface of each of the active areas 122 is denoted by $S_2$. According to the steps shown in FIG. 7(A), the height of the upper surfaces $S_1$ of the isolation layers 121 is made equal to (or higher than) the height of the upper surfaces $S_2$ of the active areas 122.

Figure 8:
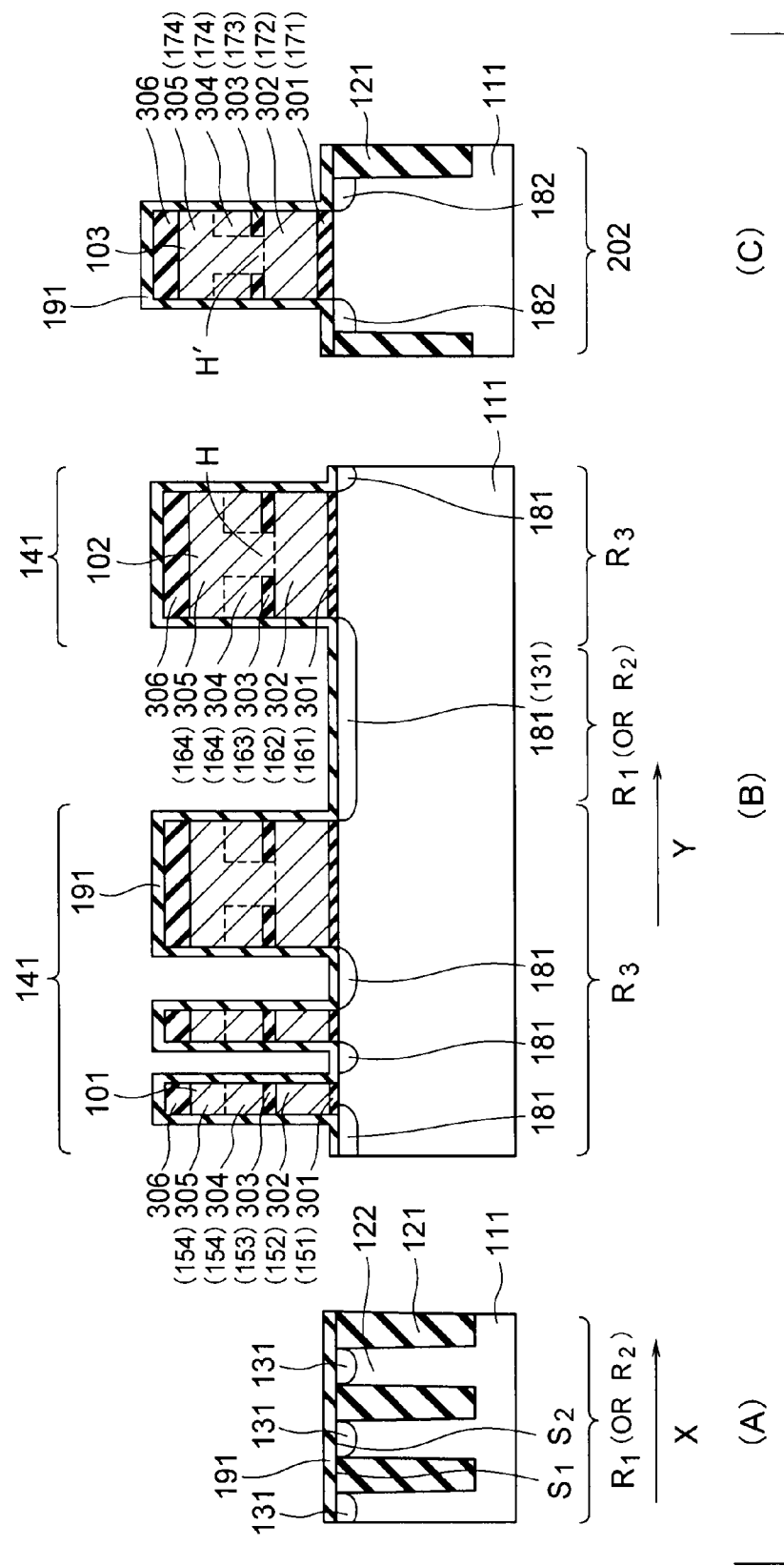

The spacer layer 191 formed of, e.g., $SiO_2$ is deposited on the entire surface of the semiconductor substrate 111, as shown in FIG. 8. In this manner, the spacer layer 191 is formed on the isolation layers 121 and the active areas 122 in the contact regions $R_1$ and $R_2$, and on the upper surfaces and side surfaces of the cell transistors 101, the select transistors 102, and the peripheral transistors 103.

The diffusion layers 131 are formed on the surfaces of the active areas 122 through ion implantation via the spacer layer 191, as shown in FIG. 8. In this embodiment, the diffusion layers 131 are n-type layers. Through this ion implantation, the source and drain diffusion layers 181 and 182 are formed below the cell transistors 101, the select transistors 102, and the peripheral transistors 103.

Figure 9:
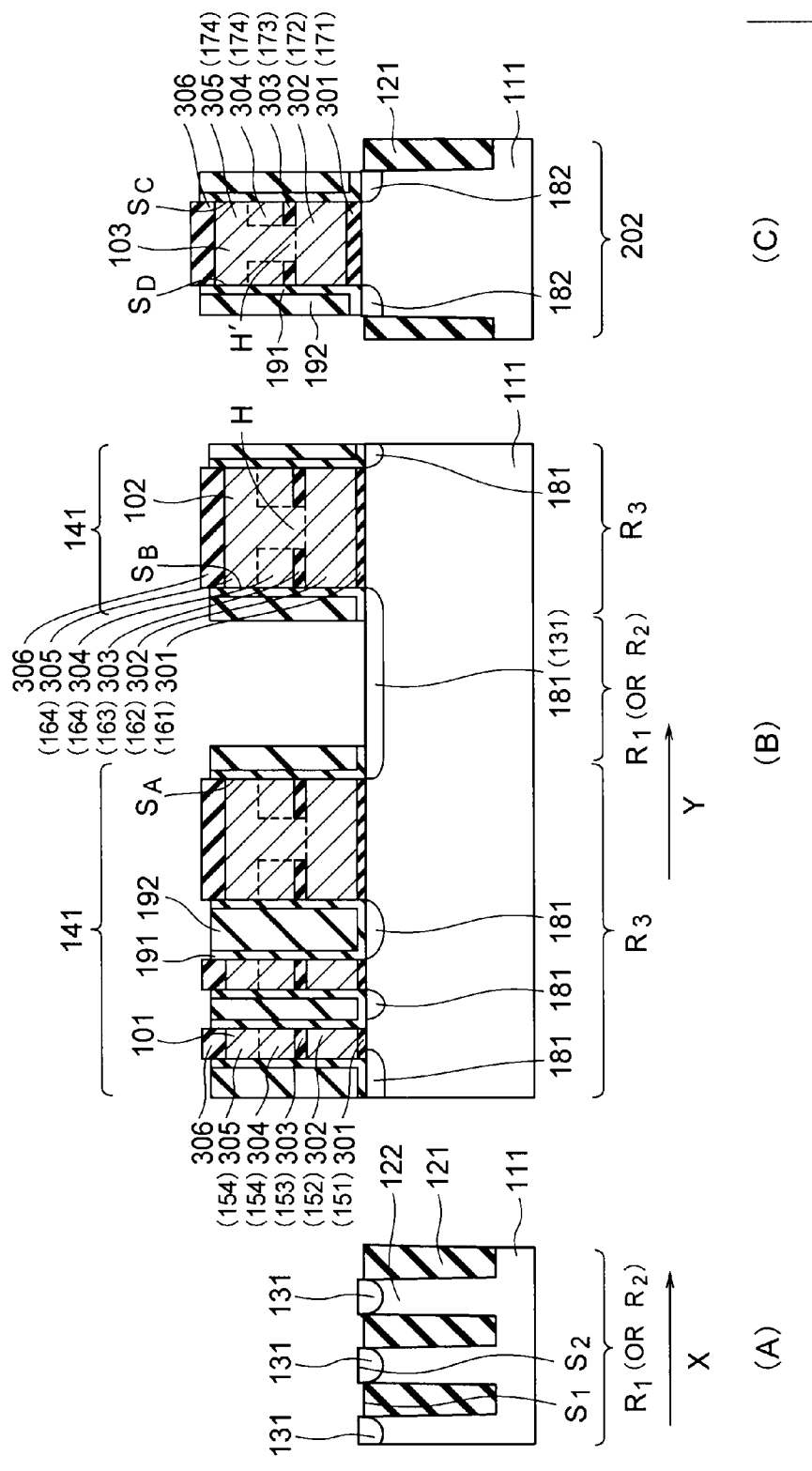

The insulating layer 192 formed of, e.g., $SiO_2$ is deposited on the spacer layer 191, as shown in FIG. 9. The insulating layer 192 is deposited until each space between transistors in each NAND string 141 is completely filled, as shown in FIG. 9. However, a space between neighboring select transistors 102 via a contact region is not completely filled with the insulating layer 192.

By performing anisotropic RIE for example, the spacer layer 191 and the insulating layer 192 are partially removed from the surface of the semiconductor substrate 111 in the contact regions $R_1$ and $R_2$, as shown in FIG. 9. As a result, the spacer layer(s) 191 and the insulating layer(s) 192 remain in the spaces between the transistors in the NAND strings 141, on the side surfaces $S_A$ and $S_B$ of the select transistors 102 on the outside of each NAND string 141, on the side surfaces $S_C$ and $S_D$ of the peripheral transistors 103 and the like.

By performing the RIE, not only the spacer layer 191 and the insulating layer 192 are partially removed, but also upper portions of the isolation layers 121 are etched, so that the upper surfaces $S_1$ of the isolation layers 121 are recessed.

Ion implantation to lower the contact resistance is then performed on the contact regions $R_1$ and $R_2$. Since the insulating layers 192 exist on portions of the semiconductor substrate 111 between the cell transistors 101, and on portions of the semiconductor substrate 111 between the select transistors 102 and the cell transistors 101, ions are not implanted into those portions of the semiconductor substrate 111, and are implanted only into portions of the semiconductor substrate 111 between the neighboring select transistors 102 via the contact regions. As a result, the impurity concentration in the diffusion layers 181 between the cell transistors 101 and between the select transistors 102 and the cell transistors 101 becomes lower than the impurity concentration in the diffusion layers 181 between neighboring select transistors 102 via the contact regions.

Figure 10:
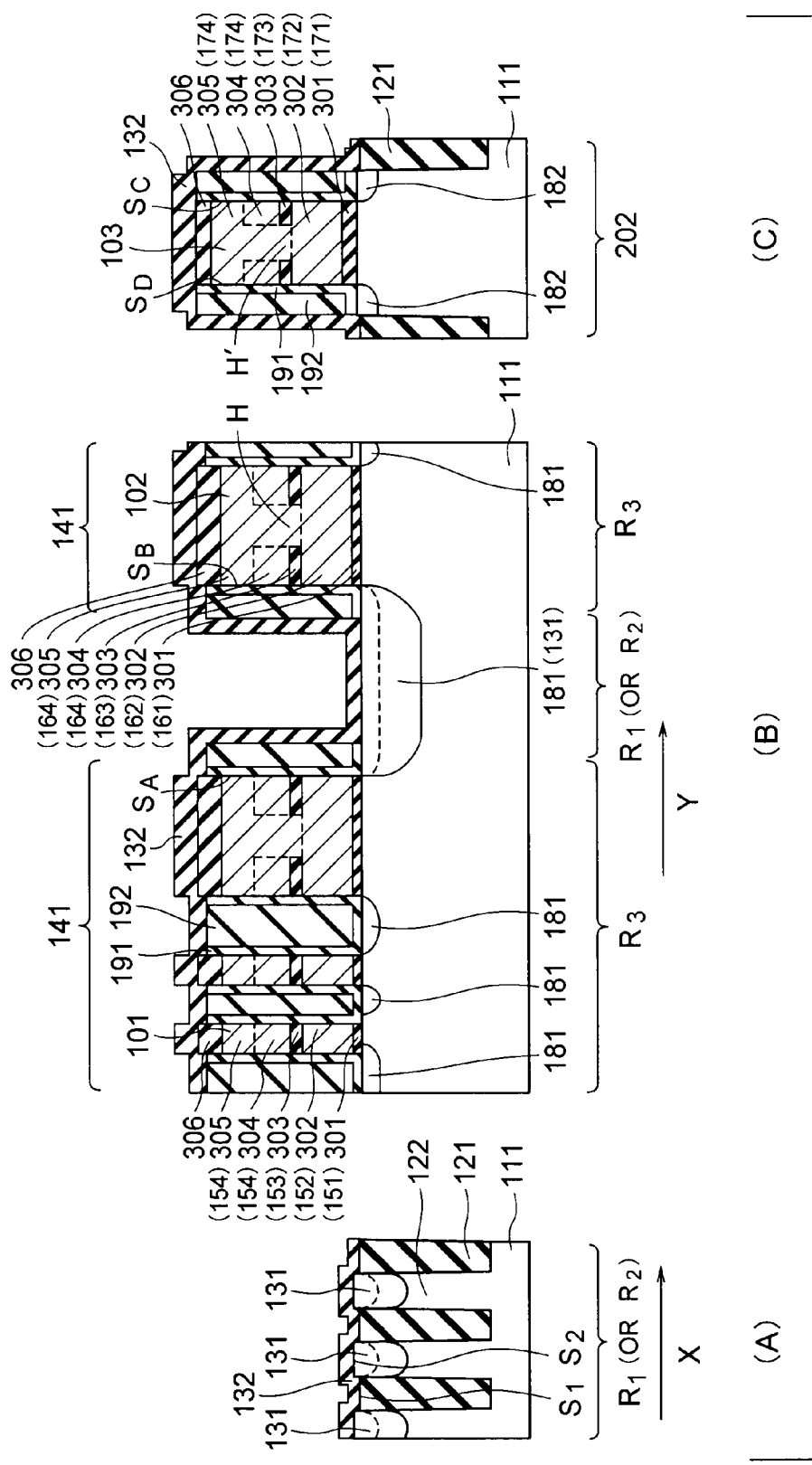

The stress liner 132 formed of, e.g., SiC, is then deposited on the entire surface of the semiconductor substrate 111, as shown in FIG. 10. In this manner, the stress liner 132 is formed on the isolation layers 121 and the active areas 122 in the contact regions $R_1$ and $R_2$, and on the upper surfaces and side surfaces of the cell transistors 101, the select transistors 102, and the peripheral transistors 103.

In this embodiment, however, each space between the transistors in each NAND string 141 is completely filled with the spacer layers 191 and the insulating layers 192. Therefore, the stress liner 132 is not formed between the transistors in each NAND string 141. Accordingly, the stress from the stress liner 132 does not change the threshold voltage of the cell transistors 101 in this embodiment.

In this embodiment, the stress liner 132 is formed after the diffusion layers 131 are formed and the upper surfaces $S_1$ of the isolation layers 121 are made lower than the upper surfaces $S_2$ of the active areas 122. Accordingly, the stress liner 132 is formed on the upper surfaces and side surfaces of the diffusion layers 131, as shown in FIG. 10.

In this embodiment, the stress liner 132 is made of a material having a smaller lattice constant than the lattice constant of the semiconductor forming the semiconductor substrate 111. With this arrangement, the compression stress from the stress liner 132 acts on the diffusion layers 131. In this embodiment, while the semiconductor substrate 111 is a silicon substrate, the stress liner 132 is made of SiC. The stress liner 132 may be made of a material other than SiC, such as SiN.

In this embodiment, annealing is then performed on the diffusion layers 131. By annealing the diffusion layers 131 having the stress liner 132 formed on the upper surfaces and side surfaces thereof, Si expansion in the region where the diffusion layers 131 are formed can be prevented in this embodiment.

Since the stress liner 132 covers not only the upper surfaces of the diffusion layers 131 but also the side surfaces of the diffusion layers 131, a strong compression stress acts on the diffusion layers 131 in this embodiment. Accordingly, Si expansion is effectively prevented in this embodiment.

Figure 11:
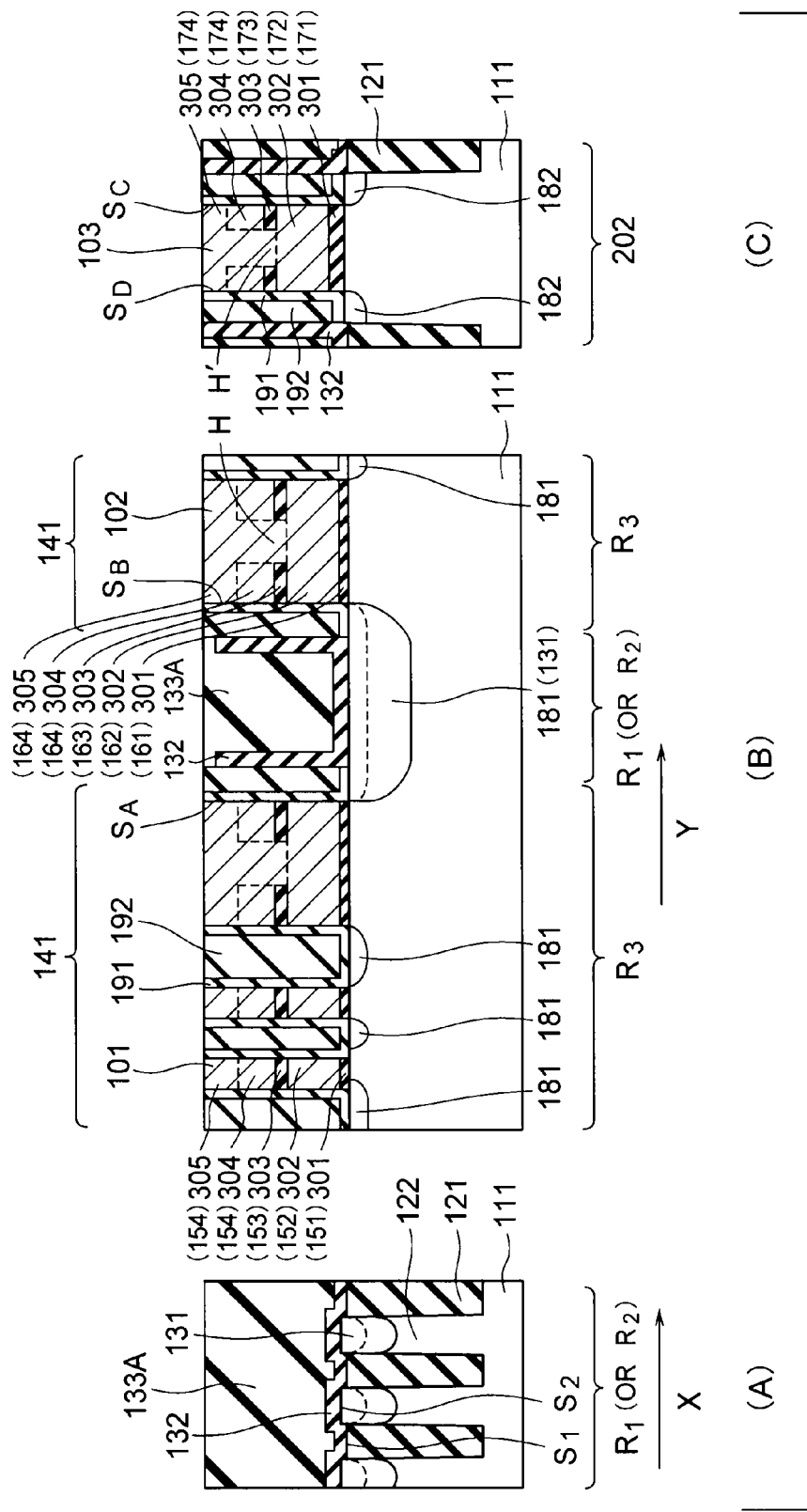

An inter layer dielectric 133A is then deposited on the entire surface of the semiconductor substrate 111, and the surface of the inter layer dielectric 133A is planarized by CMP, as shown in FIG. 11. Through the planarization, the stress liner 132 and the cap layer 306 are removed from the upper surfaces of the cell transistors 101, the cell transistors 102, and the peripheral transistors 103. The stress liner 132 and the cap layer 306 are further removed from upper surfaces of the spacer layers 191 and the insulating layers 192 formed between the cell transistors 101 and between the cell transistors 101 and the select transistors 102.

Figure 12:
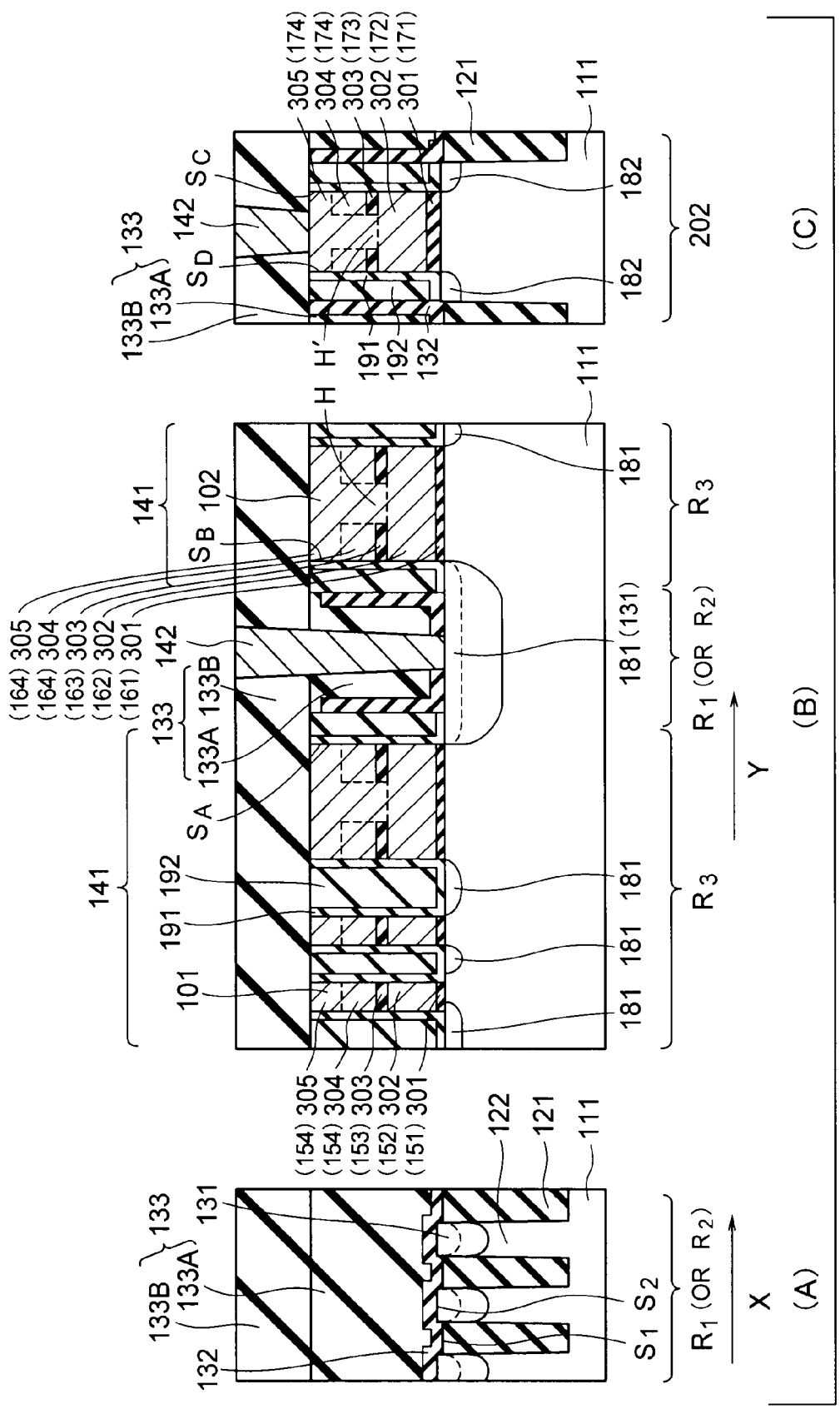

In this embodiment, the front-end process (AA/GC process) is performed in the above manner, and the back-end process (contact/interconnect process) is then performed. FIG. 12 illustrates a situation where the contact plugs 142 shown in FIG. 4 are formed in the inter layer dielectrics 133A and 133B. The inter layer dielectrics 133A and 133B are equivalent to the inter layer dielectrics 133 shown in FIGS. 3 to 5. In this manner, the semiconductor memory device of this embodiment is manufactured.

Although the diffusion layers 131 are formed before the stress liner 132 is formed in this embodiment, the diffusion layers 131 may be formed after the stress liner 132 is formed as long as it is prior to the annealing of the diffusion layers 131. This applies to a case where the diffusion layers 131 are formed through ion implantation via the stress liner 132. However, forming the diffusion layers 131 prior to the formation of the stress liner 132 as in this embodiment facilitates the control of the depth of the ion implantation in the formation of the diffusion layers 131.

As described above, according to the method of manufacturing the semiconductor memory device of this embodiment, the stress liner 132 made of a material having a smaller lattice constant than the lattice constant of Si is formed on the upper surfaces and side surfaces of the diffusion layers 131, and the diffusion layers 131 are then annealed. Accordingly, Si expansion in the regions where the diffusion layers 131 are formed can be prevented in this embodiment.

In this embodiment, the stress liner 132 is formed after the height of the upper surfaces $S_1$ of the isolation layers 121 is made lower than the height of the upper surfaces $S_2$ of the active areas 122. With this arrangement, the stress liner 132 covers not only the upper surfaces of the diffusion layers 131 but also the side surfaces of the diffusion layers 131. Accordingly, a strong compression stress acts on the diffusion layers 131, and Si expansion is effectively prevented in this embodiment.

In this embodiment, the diffusion layers 131 are formed before the stress liner 132 is formed. With this arrangement, the depth of the ion implantation performed in the formation of the diffusion layers 131 is more readily controlled than in a case where the diffusion layers 131 are formed after the stress liner 132 is formed.

In this embodiment, the impurity concentration in the diffusion layers 181 formed in the portions of the semiconductor substrate 111 between the cell transistors 101 and between the select transistors 102 and the cell transistors 101 is lower than the impurity concentration in the diffusion layers 181 formed in the portions of the semiconductor substrate 111 between the neighboring select transistors 102 via the contact regions. As a result, the expansion stress becomes smaller in the diffusion layers 181 between the cell transistors 101 and between select transistors 102 and the cell transistors 101, while the expansion stress becomes larger in the diffusion layers 181 between the neighboring select transistors 102 via the contact regions. Accordingly, the short-circuiting is not caused between the NAND strings neighboring in the channel width direction, even though the stress liner 132 is not formed between the cell transistors 101 neighboring in the channel width direction. In this embodiment, the stress liner 132 is formed only on the diffusion layers 181 with the larger expansion stress between the neighboring select transistors 102. Accordingly, the Si expansion can be effectively prevented, and changes in the threshold voltage of the cell transistors 101 can be prevented.

As described above, in this embodiment, the stress liner 132 made of a material having a smaller lattice constant than the lattice constant of the material formed of the semiconductor substrate 111 is formed on the upper surfaces and side surfaces of the diffusion layers 131. With this arrangement, a compression stress that is the opposite of an expansion stress acts on the diffusion layers 131, so that the diffusion layers 131 (semiconductor substrate 111) can be prevented from being expanded in this embodiment. Furthermore, by preventing the diffusion layers 131 from being expanded, generation of crystal defects in the semiconductor substrate 111 can be prevented.

As described above, the embodiments described herein can provide a semiconductor memory device and a method of manufacturing the same that can prevent expansion of the semiconductor substrate in the diffusion layer regions formed on the surface of the semiconductor substrate.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and sprit of the inventions.

The invention claimed is:

1. A method of manufacturing a semiconductor memory device, the method comprising:
    forming isolation layers on a surface of a semiconductor substrate to separate the substrate into active areas, the isolation layers and the active areas being arranged along a predetermined direction parallel to the surface of the semiconductor substrate;
    forming diffusion layers on surfaces of the active areas;
    forming a stress liner on upper surfaces of the diffusion layers, the stress liner being formed of a material having a lattice constant smaller than a lattice constant of a material forming the semiconductor substrate;
    forming gate structures of cell transistors and of first and second select transistors arranged to sandwich the cell transistors, on the semiconductor substrate before the stress liner is formed;
    burying insulators between the cell transistors and between the cell transistors and the select transistors before the stress liner is formed, a compression stress of the insulators to the material forming the substrate being smaller than a compression stress of the stress liner to the material forming the substrate; and
    annealing the diffusion layers after the stress liner is formed.

2. The method according to claim 1, further comprising:
    removing the stress liner formed on the cell transistors and the select transistors, and on the insulators formed between the cell transistors and between the cell transistors and the select transistors.

3. The method according to claim 1, wherein the forming the isolation layers to separate the substrate into the active areas comprises:
    forming the isolation layers to make a height of the upper surfaces of the isolation layers be equal to or higher than a height of the upper surface of the semiconductor substrate, and then etching upper portions of the isolation layers to expose side surfaces of the diffusion layers
    wherein the stress liner is formed on the side surfaces of the diffusion layers.

4. The method according to claim 3, wherein
    the insulators buried between the cell transistors and between the cell transistors and the select transistors are also formed on the diffusion layers when the insulators are formed, and
    the insulators formed on the diffusion layers are removed simultaneously with the etching of the upper portions of the isolation layers.

5. The method according to claim 3, wherein
    the stress liner is continuously formed on the upper surfaces and side surfaces of the diffusion layers and on the upper surfaces of the isolation layers.

6. A semiconductor memory device comprising:

a semiconductor substrate;

isolation layers formed in a surface of the semiconductor substrate, and separating the semiconductor substrate into active areas, the isolation layers and the active areas being alternately arranged along a first direction parallel to the surface of the semiconductor substrate, and extending in a second direction perpendicular to the first direction, a height of upper surfaces of the isolation layers being lower than a height of an upper surface of the semiconductor substrate;

memory strings, each of the memory strings comprising:

cell transistors formed on one of the active areas along to the second direction, and first and second select transistors formed on the active area and arranged to sandwich the cell transistors;

diffusion layers formed in surfaces of the active areas between the memory strings;

a stress liner formed on upper surfaces and side surfaces of the diffusion layers, and formed of a material having a lattice constant smaller than a lattice constant of a material forming the semiconductor substrate; and insulators buried between the cell transistors and between the cell transistors and the select transistors, a compression stress of the insulators to the material forming the substrate being smaller than a compression stress of the stress liner to the material forming the substrate.

7. The device according to claim 6, wherein the memory strings are adjacent to each other in the second direction, between the memory strings, the stress liner is formed on the side surfaces of the select transistors in the second direction, and on the upper surfaces and side surfaces of the diffusion layers in a section parallel to the first direction, and in the memory strings, the stress liner is not formed between the cell transistors and between the cell transistors and the select transistors.

8. The device according to claim 6, wherein a height of bottom surfaces of the diffusion layers is lower than the height of the upper surfaces of the isolation layers.

9. The device according to claim 6, further comprising:

peripheral transistors formed on the semiconductor substrate around a region where the cell transistors and the select transistors are formed, each of the peripheral transistors comprising:

a gate insulator formed on the semiconductor substrate;

a gate electrode formed on the gate insulator; and source and drain diffusion layers formed on the surface of the semiconductor substrate to sandwich the gate electrode, wherein the stress liner is formed on side surfaces of the gate electrode.

10. The device according to claim 6, wherein the stress liner covers the side surfaces of the diffusion layers, located higher than bottom surfaces of the diffusion layers.

* * * * *